United States Patent
Yu et al.

(10) Patent No.: US 8,071,414 B2
(45) Date of Patent: Dec. 6, 2011

(54) ORGANIC PHOTOVOLTAIC DEVICE WITH IMPROVED POWER CONVERSION EFFICIENCY AND METHOD OF MANUFACTURING SAME

(75) Inventors: Jae-Woong Yu, Seoul (KR); Byung Doo Chin, Seoul (KR); Jai Kyeong Kim, Seoul (KR); Nam Soo Kang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 573 days.

(21) Appl. No.: 12/191,243

(22) Filed: Aug. 13, 2008

(65) Prior Publication Data
US 2009/0133752 A1 May 28, 2009

(30) Foreign Application Priority Data
Nov. 23, 2007 (KR) .................. 10-2007-0120363

(51) Int. Cl.
*H01L 21/00* (2006.01)
(52) U.S. Cl. ........ 438/57; 438/80; 438/82; 257/E25.009
(58) Field of Classification Search .............. 438/80, 438/48, 57, 73, 82; 136/244, 246, 256; 257/E25.009
See application file for complete search history.

(56) References Cited

U.S. PATENT DOCUMENTS

| | | | | |
|---|---|---|---|---|
| 4,872,925 A | * | 10/1989 | McMaster | 136/244 |
| 6,265,653 B1 | * | 7/2001 | Haigh et al. | 136/249 |
| 6,452,082 B1 | * | 9/2002 | Suzuki et al. | 84/609 |

FOREIGN PATENT DOCUMENTS

| | | |
|---|---|---|
| JP | 60-149178 | 8/1985 |
| KR | 1020050011817 | 1/2005 |

OTHER PUBLICATIONS

Tang, "Two-layer organic photovoltaic cell," *Appl. Phys. Lett.*, 48:183-185 (1986).
Halls et al., "Exciton diffusion and dissociation in a poly (p-phenylenevinylene)/$C_{60}$ heterojunction photovoltaic cell," *Appl. Phys. Lett*,. 68:3120-3122 (1996).
Ma et al., "Thermally Stable, Efficient Polymer Solar Cells with Nanoscale Control of the Interpenetrating Network Morphology," *Adv. Funct. Mater.* 15:1617-1622 (2005).

(Continued)

*Primary Examiner* — Brook Kebede
(74) *Attorney, Agent, or Firm* — Ladas & Parry LLP

(57) ABSTRACT

The present invention relates to a method of fabricating an organic photovoltaic device with improved power conversion efficiency by reducing lateral contribution of series resistance between subcells through active area partitioning by introducing a patterned structure of insulating partitioning walls inside the device. According to the method of the present invention, since the lateral contribution of series resistance between the partitioned subcells is minimized and each subcell works independently, there is no interference phenomenon against the current output of each subcells. As such, the function of a charge extraction layer with high conductivity can be maximized. Thus, the method of the present invention can be effectively used in the fabrication and development of a next-generation large area organic thin layer photovoltaic cell device.

9 Claims, 3 Drawing Sheets

OTHER PUBLICATIONS

Padinger et al., "Effects of Postproduction Treatment on Plastic Solar Cells," *Adv. Funct. Mater.*, 13:85-88 (2003).

Sariciftci et al,. "Semiconducting polymer-buckminsterfullerene heterojunctions: Diodes, photodiodes, and photovoltaic cells," *Appl. Phys. Lett.*, 62:585-587 (1993).

Shaheen et al., "2.5% efficient organic plastic solar cells," *Appl. Phys. Lett,.* 78:841-843 (2001).

Yoo et al., "Integrated organic photovoltaic modules with a scalable voltage output," *Appl. Phys. Lett..* 89:233516 (2006).

Office Action for Korean Patent Application No. 10-2007-120363, mailed Aug. 25, 2009, 11 pages, in English and Korean.

Moon et al., Polymer Science and Technology vol. 17, No. 4, pp. 407-415 (Aug. 2006).

\* cited by examiner

ORGANIC PHOTOVOLTAIC DEVICE WITH IMPROVED POWER CONVERSION EFFICIENCY AND METHOD OF MANUFACTURING SAME

The present application claims priority from Korean Patent Application No. 10-2007-120363 filed Nov. 23, 2007, the entire contents of which are incorporated herein by reference.

FIELD OF THE INVENTION

The present invention relates to a method of manufacturing an organic photovoltaic device with improved power conversion efficiency by reducing lateral contribution of series resistance which obtained by partitioning off an active layer through the introduction of a patterned insulating walls inside the device. The present invention further relates to an organic photovoltaic device manufactured using the above method.

BACKGROUND OF THE INVENTION

Extensive research for improving power conversion efficiency has been actively performed ever since an organic thin layer solar (photovoltaic) cell having power conversion efficiency of about 1% was developed by Tang in 1986 (C. W. Tang, *Appl. Phys. Lett.* 48: 183, 1986). Unfortunately, such research is currently at a standstill. A pioneering improvement in power conversion efficiency was achieved in early 2000, which has recently been put to practical use.

Since organic materials considered as a p-type semiconductor form excitons upon the absorption of photons and have low electron mobility, an organic thin layer photovoltaic cell must be constructed through junctions between p-type and n-type semiconductors. When an organic thin layer photovoltaic cell using fullerene having high electron mobility was introduced for the first time in 1993, such a device did not come into the spotlight due to its extremely low power conversion efficiency (N. S. Sariciftci, et al., *Appl. Phys. Left.* 62: 585, 1993; J. J. M. Halls, et al., *Appl. Phys. Lett.* 68: 3120, 1996). A photovoltaic device having power conversion efficiency of about 2.5%, which was fabricated by blending poly(3-hexylthiophene) (P3HT) as a conductive polymer and fullerene (S. E. Shaheen, et al., *Appl. Phys. Lett.* 78: 841, 2001) as an electron transporting material, has been reported. Further, various attempts have been made to develop organic thin layer photovoltaic cells using the above mixture. A photovoltaic device having a power conversion efficiency of about 3.5% was developed in 2003 (F. Padinger, et al., *Adv. Funct. Mater.* 13: 85, 2003). Thereafter, an organic thin layer photovoltaic cell having a conversion efficiency of about 5% was developed by changing a blend ratio of P3HT and fullerene, and improving electron transportation rate through heat treatment (W. Ma, et al., *Adv. Funct. Mater.* 15: 1617, 2005).

It has been found that such a rapid improvement in power conversion efficiency is due to several causes, for example, an better formation of a bicontinuous phase (i.e., interpenetrating network) by changing a composition ratio of the composite, a morphological modification of the composite through heat treatment, an increase in hole mobility by improving P3HT crystallization, an enhanced adhesiveness between an active layer and a metal electrode, etc. The continuous improvement of composite characteristics makes possible to develop an organic thin layer photovoltaic cell having a power conversion efficiency of about 6%.

As described above, the organic thin layer photovoltaic cell using polymer has been currently fabricated by applying a mixture of P3HT with high hole mobility and fullerene with high electron mobility on a transparent conductive substrate such as ITO substrate. To achieve high power conversion efficiency, it is indispensable to use a conductive polymer, PEDOT:PSS [poly(3,4-ethylenedioxythiophene):poly(4-styrene sulfonate)], as a charge extraction layer and decrease contact resistance between a photovoltaic active layer and a metal electrode due to ohmic contact therebetween. Such use of a polymer:organic material blend has an advantage in that a device can be easily fabricated by mixing two kinds of organic semiconductors in a solvent by means of high processability of polymer and simply spin-coating the resulting mixture on a substrate. Thus, a fabricated organic semiconductor has been regarded as a future-oriented photovoltaic cell due to its simplicity, flexibility and low unit cost of production.

However, since such an organic semiconductor actually shows semiconductor characteristics, it has relatively high electric resistance. Further, it has been reported that the larger the device area is, the higher the series resistance is (B. Kippelen, et al., *Appl. Phys. Lett.* 89: 233516, 2006). Based on the above, there is a problem in that in a large area device, lateral contribution of series resistance which influences each other at different parts within the device being connected by the same charge transporting layer is increased. As such, total series resistance of the device is increased in proportion to the increased active area, which results in reducing the charge generation and power conversion efficiency.

Thus, the present inventors have endeavored to overcome the above problems of the prior art and found that if the device is divided into smaller size subcells by introducing device partitioning walls made of an insulating material inside the device during the fabrication of an organic photovoltaic device, each of the partitioned subcells works independently of each other. As such, their lateral contribution of series resistance does not mutually influence, which results in improving the power conversion efficiency of the partitioned device through the lowering of series resistance applied to the inside thereof.

SUMMARY OF THE INVENTION

The primary object of the present invention is to provide an organic photovoltaic device capable of maintaining high power conversion efficiency through a lowering of series resistance even though it is fabricated as a large area device.

In accordance with one embodiment of the present invention for achieving the above object, there is provided a method of fabricating an organic photovoltaic device with improved power conversion efficiency by reducing series resistance between the devices through active area partitioning by introducing insulating partitioning walls inside the device.

In accordance with another embodiment of the present invention, there is provided an organic photovoltaic device with improved power conversion efficiency, which is fabricated according to the method of the present invention.

BRIEF DESCRIPTION OF THE DRAWINGS

The embodiments of the present invention will be described in detail with reference to the following drawings.

101: transparent electrode (e.g., ITO)

102: electrode protection/charge extraction layer [e.g., poly-3,4-ethylenedioxythiophene (PEDOT):polystyrene-sulphonate (PSS)]

103: insulating partitioning walls

104: photovoltaic active layer

105: organic protection layer

106: metal electrode (e.g., aluminum)

Figure 2:
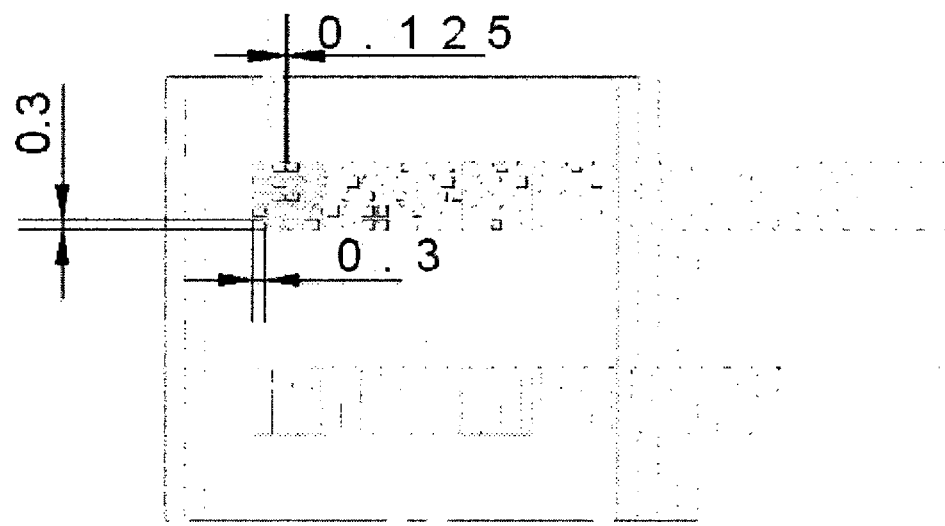

FIG. 2 is a diagram illustrating organic photovoltaic devices fabricated on a transparent substrate according to the area partitioning method of the present invention through area partition and the prior art method.

Figure 3A:
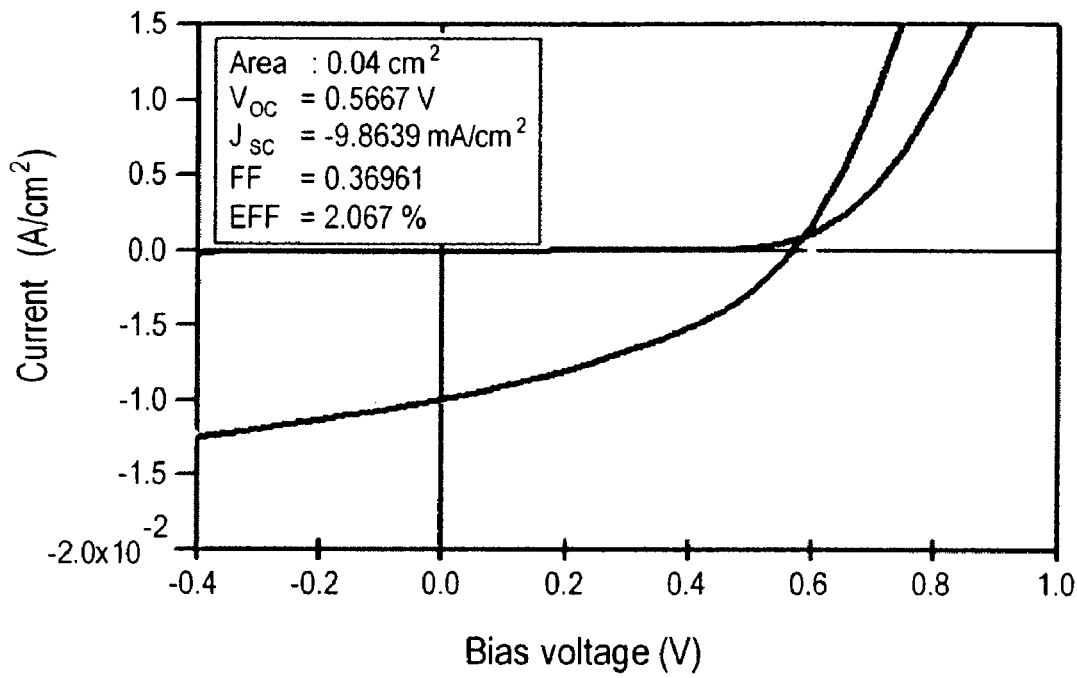
Figure 3B:
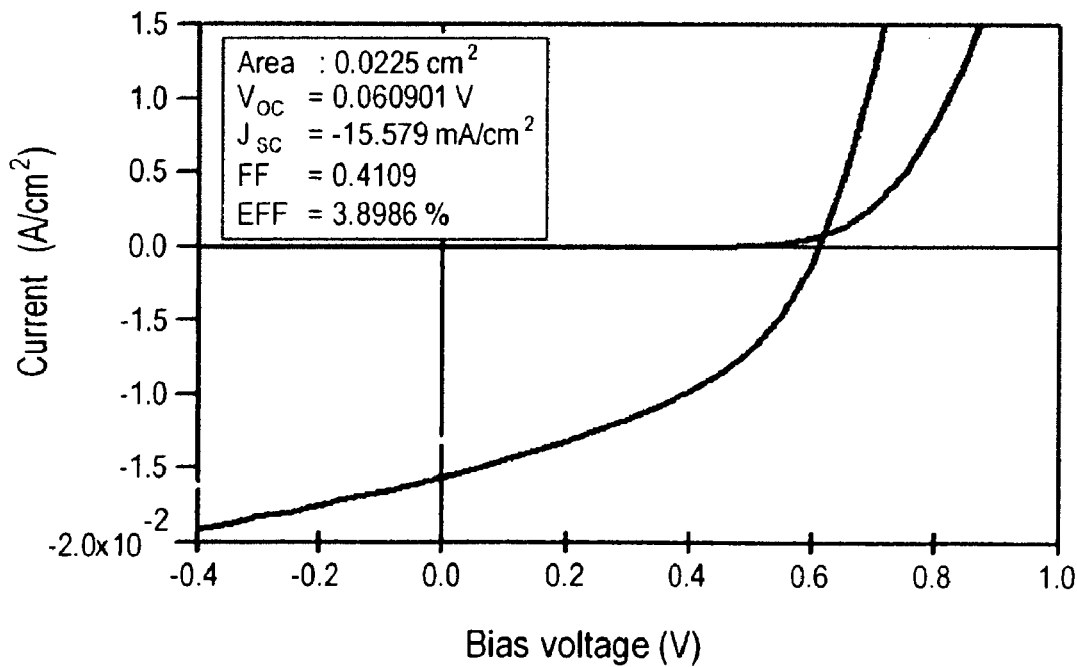

FIGS. 3a and 3b show the results of comparing current-voltage characteristics of organic photovoltaic devices fabricated according to the method of the present invention through active area partitioning and the prior art method, respectively.

Figure 4A:
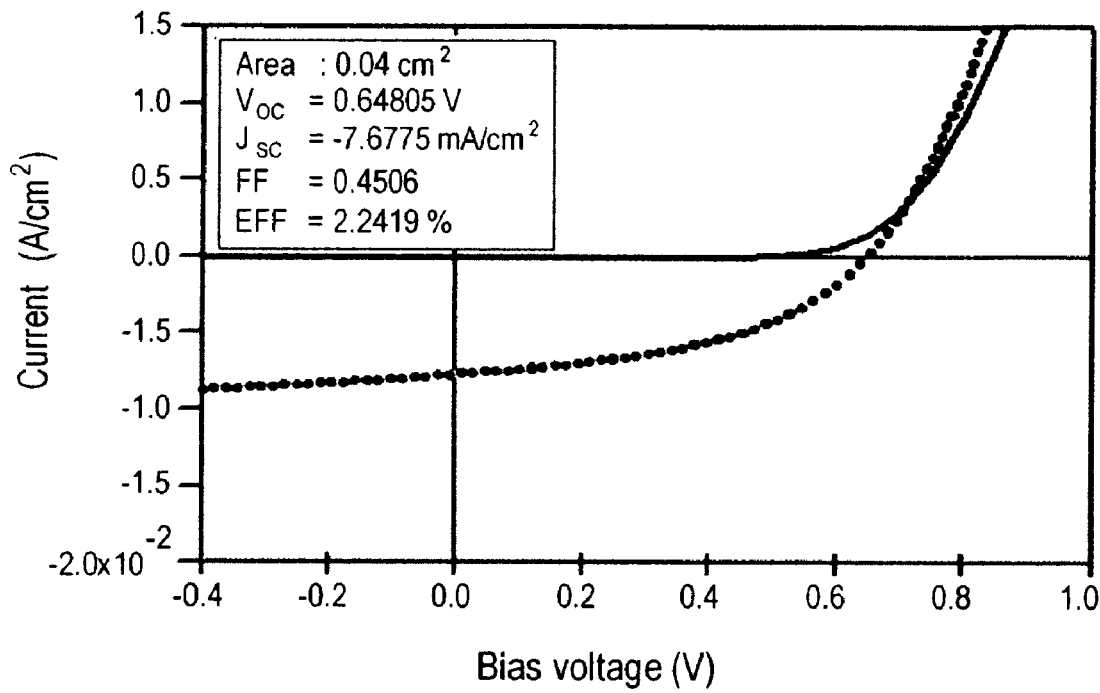
Figure 4B:
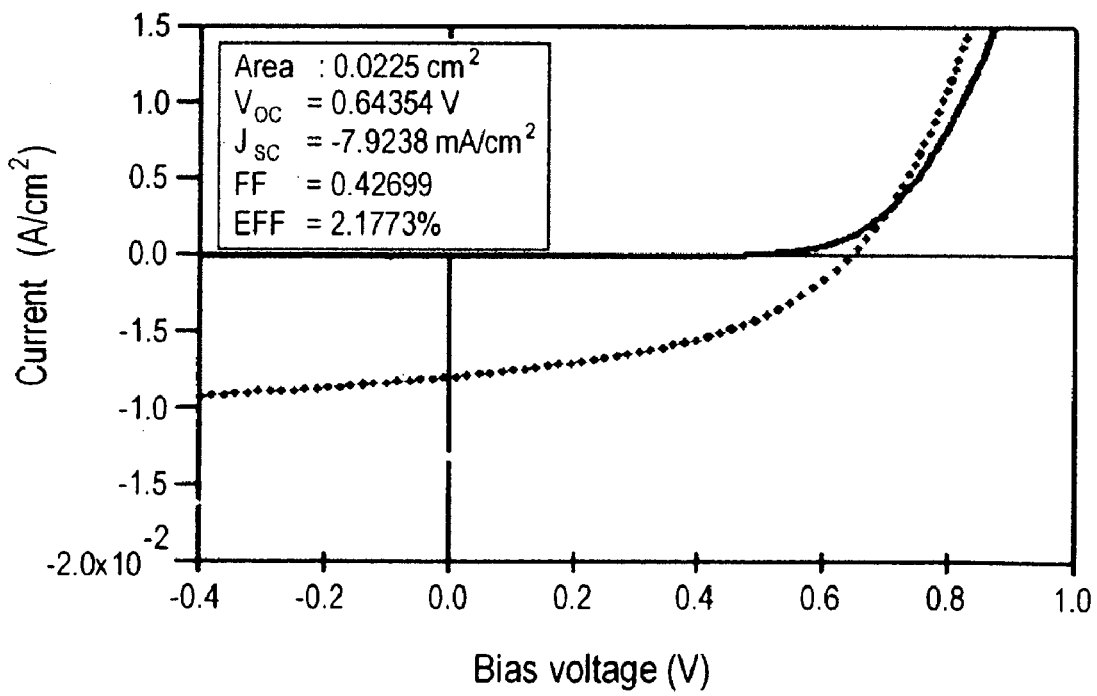

FIGS. 4a and 4b show the results of comparing current-voltage characteristics of organic photovoltaic devices fabricated according to the method of the present invention through active area partitioning by using a low-conductive charge extraction layer and the prior art method, respectively.

DETAILED DESCRIPTION OF THE INVENTION

The method of the present invention is characterized in that it can fabricate an organic photovoltaic device with improved power conversion efficiency by introducing insulating partitioning walls inside the device, which significantly reduces lateral contribution of series resistance between subcells and allows each partitioned subcell worked independently, leading to the minimization of an interference phenomenon due to the lateral contribution of series resistance.

In particular, the method of manufacturing an organic photovoltaic device with improved power conversion efficiency according to the present invention may comprise the following steps:

1) forming a pattern of insulating partitioning walls on top of a transparent electrode which is formed on a transparent substrate;

2) forming an electrode protection/charge extraction layer on the transparent electrode on which the insulating partitioning walls are formed;

3) forming a p-n type polymer nanocomposite structure on the electrode protection/charge extraction layer; and 4) depositing a metal electrode on the p-n type polymer nanocomposite structure.

Compared with the prior art method of fabricating an organic polymer thin layer photovoltaic device, the technical feature of the method according to the present invention is to increase the power conversion efficiency of a device which is characterized by employing a high-conductive charge extraction layer for more efficient charge extraction, partitioning off the device into smaller subcells by introducing insulating partitioning walls inside the device, reducing lateral contribution of series resistance between the subcells, thereby maximizing the role of charge extraction layer with high-conductivity within each of the partitioned devices.

The method of the present invention is a device technique which can remarkably improve the prior art fabrication method of an organic thin layer photovoltaic cell and be applied to all types of materials. Different from the prior art method which introduces metal lines having low resistance inside the device for easy current extraction, the method of the present invention fabricates an organic photovoltaic device with improved power conversion efficiency by introducing insulating partitioning walls inside the device by means of a conventional technique in the art such as coating, printing or lithography, thereby leading to a lowering of lateral contribution of series resistance between the partitioned subcells.

Hereinafter, the method of the present invention is described in more detail.

Step 1) is a step where the device is subjected to active area partitioning into smaller subcells by forming a patterned structure of insulating partitioning walls on a transparent electrode. The patterned structure of the insulating partitioning walls suitable for the present invention is formed on a transparent electrode by using polymer-based insulating materials such as acrylic polymers, polyimides, polysiloxanes ane the like.

The patterned structure of the insulating partitioning walls can be formed by various techniques well known in the art, and the representative examples of which may include, but are not limited to the following: coating techniques such as spin coating, dip coating, blade coating, bar coating, slot-die coating and spray coating; printing techniques such as inkjet printing, gravure printing, offset printing and screen printing; vacuum deposition techniques such as evaporation and sputtering; lithography techniques such as photolithography and imprint lithography; transcription techniques such as laser/lamination heat transcription; and laser ablation technique.

Examples of the transparent substrate suitable for the present invention may include, but are not limited to, glass, silica and transparent plastics such as PET (polyethylene terephthalate), polyethersulfone and the like. Those of the transparent electrode may include, but are not limited to, transparent conducting oxide (TCO) such as indium tin oxide (ITO), indium zinc oxide (IZO) and aluminum-doped zinc oxide, poly(3,4-ethylenedioxythiophene):poly(4-styrene-sulphonate) (PEDOT:PSS), polyaniline, polypyrrole and the like.

In step 2), an electrode protection/charge extraction layer is formed on the transparent electrode on which the insulating partitioning walls are formed. The electrode protection/charge extraction layer can be formed by various techniques including spin coating, vacuum heat deposition, imprinting, inkjet printing and the like.

The method of the present invention employs a high-conductive electron protection/charge extraction layer for more efficient charge extraction. Examples of the electron protection/charge extraction layer suitable for the present invention may include polyethylenedioxythiophene:polystyrenesulfonate (PEDOT:PSS), polyaniline, polypyrrole and the like.

When the device is partitioned off into smaller subcell by introducing insulating partitioning walls therein and the electrode protection/charge extraction layer is then formed on each partitioned subcells, lateral contribution of series resistance between the partitioned subcells is minimized because the charge extraction layer at the center of partitioning walls is disconnected and each of the partitioned subcells works independently. As such, it does not cause any interference phenomenon on current output from each subcell, which results in maximizing the role of charge extraction layer with high conductivity. Thus, the method of the present invention can significantly improve the power conversion efficiency of the device.

Step 3) is a step of forming a p-n type polymer nanocomposite structure as a photovoltaic active layer on the electrode protection/charge extraction layer. The p-n type polymer nanocomposite structure can be formed in a bicontinuous interpenetrating network structure by blending a p-type polymer with an n-type polymer on the electrode protection/charge extraction layer.

At this time, the p-type polymer suitable for the present invention may include polythiophene and derivatives thereof, poly(para-phenylene) and derivatives thereof, polyfluorene and derivatives thereof, polyacetylene and derivatives thereof, etc. However, it is certainly not limited to the above. The n-type polymer suitable for the present invention may include, but is not limited to the following: fullerene such as C60 fullerene and C70 fullerene; and high electron affinity organic materials such as 3,4,9,10-perylenetetracarboxylic bisbenzimidazole (PTCBI) and derivatives thereof. In a preferred embodiment of the present invention, the polymer composite layer is formed by spin-coating of poly(3-hexylthiophene) (P3HT) and PCBM ([6,6]-phenyl $C_{61}$-butyric acid methyl ester) at an optimal blending ratio, treating the same with heat so as to form a bicontinuous interpenetrating network structure where charge transporting passages are well secured.

Step 4) is directed to depositing a metal electrode on the p-n type polymer nanocomposite structure. Examples of the metal electrode suitable for the present invention may include, but are not limited to, aluminum, magnesium, lithium, calcium, copper, silver, gold, platinum and an alloy thereof.

The technical feature of the present invention is to introduce insulating partitioning walls inside the device while fabricating an organic polymer thin layer photovoltaic device according to a prior art method so as to partition off the device into several smaller subcells. This causes each of the partitioned subcells to work independently from other partitioned subcells and further does not cause any interference phenomenon due to mutual lateral contribution of series resistance. Further, the method of the present invention can reduce the series resistance applied to the partitioned subcells. This significantly improves the power conversion efficiency of the device.

Polymers have several advantages in showing an improved inner quantum efficiency due to increased charge mobility even though low external voltage is applied thereto, have high processability and flexibility, are easily fabricated into a large area device by using a coating or printing technique at room temperature in a cost effective manner, and are capable of regulating its band gap via molecular design. Thus, they have been in the limelight as a next-generation photovoltaic device material.

In order to improve the power conversion efficiency of an organic photovoltaic device, a photovoltaic device must first show a high light absorption rate. This is because the more excitons are generated in the device by absorbing more light, the higher it generates electric charges. Next, charge separation efficiency at a p-n interface, i.e., electron-hole separation efficiency, must be high. Since excitons can be separated into electrons and holes only around the p-n interface, they must be generated at a photoactive area neighboring the interface. Further, only when the HOMO (highest occupied molecular orbital) and LUMO (lowest unoccupied molecular orbital) difference between the p-type and n-type semiconductors is larger than that of exciton binding energy, generated excitons can be broken into electrons and holes. In addition, if the generated electrons and holes do not move away, they will recombine into excitons. Thus, it is very important to transport smoothly and rapidly the generated electrons and holes so as to prevent from recombining with each other. Furthermore, one type of electrical charge should not be accumulated inside the device through uniform transportation of the electrons and holes. Especially, since most polymers have significantly lower charge mobility than inorganic materials, there is a need to provide a channel for smooth transportation, and the mobility of electron has to be similar to that of hole for efficiently preventing the unequal accumulation of electrical charge. Further, when the electrical charges are successfully transferred to an electrode, the electrons or holes are not accumulated within the device. Accordingly, there is no excessive load applied to the inside of the device, which results in prolonging the lifetime of the device. Generally, in the case of organic/inorganic heterojunction or small molecule/large molecule heterojunction, since hetero-materials used therein have different transport mechanisms, they show different mobilities. Thus, it is preferred that the p- and n-type polymers have similar charge mobility. In addition, it is preferable to lower the resistance against the transportation of electrical charges to the electrode by forming an ohmic contact between the device material and the metal electrode material.

As described above, the use of a polymer blend makes possible to easily fabricate a large area device by directly forming a bicontinuous interpenetrating network polymer composite film through spin coating of a solution sample. If the bicontinuous interpenetrating network polymer composite film is formed in a p-n junction type like this, the excitons generated by light absorption are more efficiently separated into electrons and holes due to the increased p-n interface. Further, since in the bicontinuous interpenetrating network structure, the p- and n-type polymers are directly connected to appropriate electrodes, the generated electrons or holes can be easily transported to the corresponding electrodes. This leads to the increase in power conversion efficiency while preventing the electrons and holes from recombining back into excitons. Furthermore, it is possible to prevent the electrical charge from accumulating within the device by smoothly transporting them through the secured charge transporting passages, which results in removing an excessive load applied to the inside of the device, thereby prolonging the lifetime of the device.

The recently reported technique for achieving improved power conversion efficiency relates to a method of forming a bicontinuous interpenetrating network polymer composite film wherein electrical charge transport routes are secured thereon by spin-coating of a conductive polymer (P3HT) and a fullerene derivative (PCBM: [6,6]-phenyl $C_{61}$-butyric acid methyl ester) at an optimal blending ratio, which is then followed by heat treatment.

However, the prior art method of fabricating a device by inserting the conductive polymer-fullerene blend having a bicontinuous interpenetrating network structure between a transparent electrode and a metal electrode is problematic in that it shows an increased series resistance due to the use of organic semiconductors showing relatively high resistance and interrupts the flow of electrical charge to thereby reduce the power conversion efficiency, particularly in proportion to the increased device active area. Due to such a phenomenon, in order to fabricate an organic photovoltaic device showing high power conversion efficiency according to the prior art method, both the low series resistance and high shunt resistance are indispensable.

However, the method of the present invention is devised such that insulating partitioning walls are introduced inside the device so as to partition off into several smaller subcells. Further, high conductive electron protection/charge extraction layer is formed at each of the partitioned subcells in order to effectively collect electrical charge. According to said conception of the present invention, since lateral contribution of series resistance between the partitioned subcells is minimized and each subcell works independently, there is no interference phenomenon against the current output of each subcell. As such, the function of the high conductive charge extraction layer can be maximized. Thus, the method of the present invention can be effectively used for fabricating an organic photovoltaic device having an improved power conversion efficiency.

Further, the present invention provides an organic photovoltaic device fabricated according to the method of the present invention, which comprises a transparent substrate, a transparent electrode, insulating partitioning walls, an electron protection/charge extraction layer, a p-n type polymer nanocomposite structure and a metal electrode layer. The organic photovoltaic device according to the present invention continuously exhibits high power conversion efficiency by reducing lateral contribution of series resistance through active area partitioning by introducing insulating partitioning walls inside the device and minimizing the interference phenomenon against the current output of each subcell.

Further, all of the systems employed in the method of the present invention can be subject to a solution process at room temperature and do not include any complicated process. Thus, they do not require a high temperature process, which is indispensable to a dye-sensitized organic/inorganic hybrid nanoparticle system of the prior art. Accordingly, the method of the present invention can develop flexible thin layer photovoltaic materials having high quantum efficiency due to such a characteristic structure, which can be effectively used as a solar cell or an optical sensor.

Hereinafter, embodiments of the present invention will be explained in more detail with reference to the accompanying drawings.

Figure 1:
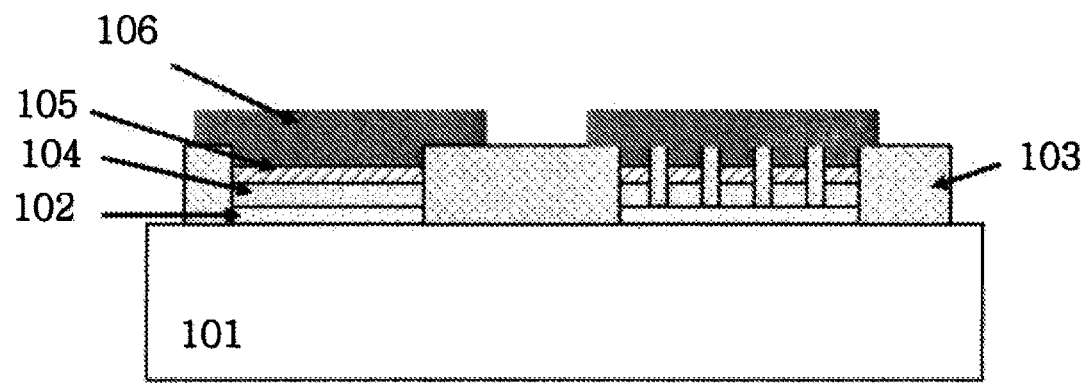
FIG. 1 is a cross-sectional view of a device which is subjected to active area partitioning by introducing a patterned structure of insulating partitioning walls inside the device according to the method of the present invention.

FIG. 1 is a cross-sectional view of a device which is subjected to active area partitioning by introducing insulating partitioning walls therein according to the present invention. In FIG. 1, 101 refers to a transparent electrode such as ITO, 102 refers to an electrode protection/charge extraction layer such as poly-3,4-ethylenedioxythiophene (PEDOT):polystyrenesulphonate (PSS), 103 refers to insulating partitioning walls, 104 refers to a photovoltaic active layer, 105 refers to an organic protection layer, and 106 refers to a metal electrode such as aluminum.

FIG. 2 is a diagram illustrating two types of organic photovoltaic devices fabricated by active area partitioning according to the method of the present invention and the prior art method, respectively, wherein a single large area compartment has no partitioning wall and a plurality of small area subcells introduced with partitioning walls are formed on a single device. Such a device can reduce errors that can occur during the fabrication process. This allows the accurate assessment of the device characteristics for a single area cell and partitioned subcells.

FIGS. 3a and 3b show the results of comparing current-voltage characteristic of the organic photovoltaic device fabricated by active area partitioning according to the method of the present invention with that fabricated by the prior art method, respectively. It has been found that the organic photovoltaic device fabricated by active area partitioning with insulating partitioning walls according to the present invention exhibits about 2-fold higher power conversion efficiency compared to that fabricated according to the prior art method under the same conditions.

FIGS. 4a and 4b show the results of comparing current-voltage characteristic of the organic photovoltaic device fabricated by active area partitioning using a low-conductive charge extraction layer according to the method of the present invention with that fabricated by the prior art method. It has been confirmed that in case of using a low conductive material as an electrode protection layer, even if the device is fabricated in a small area type by active area partitioning with insulating partitioning walls, there is no significant increase in the power conversion efficiency of a single area cell and partitioned subcells.

As discussed above, the method of the present invention can maintain the maximum power conversion efficiency by minimizing the lateral contribution of series resistance between the partitioned subcells through active area partitioning, even though an organic photovoltaic device is fabricated in a large area type. Thus, the organic photovoltaic device fabricated according to the method of the present invention can be effectively used as a solar cell or an optical sensor. As such, the method of the present invention is a pioneering technique that improves the prior art fabrication technique of an organic thin layer photovoltaic cell and is capable of being applied to all types of materials. Further, the method of the present invention can fabricate an optimal device showing the maximum power conversion efficiency by using all types of optimal materials known in the art. In addition, since the method of the present invention does not require any particular condition for fabricating a device such as high temperature, vacuum and the like, it can be effectively applied to the development of a next-generation large area platform organic thin layer photovoltaic cell device.

EXAMPLES

Embodiments of the present invention will now be described in more detail with reference to the following examples. However, the examples are provided for the purpose of illustration and are not to be construed as limiting the scope of the invention.

Example 1

Fabrication of an Organic Photovoltaic Device by Active Area Partitioning

As illustrated in FIG. 2, the following process was carried out to fabricate a single device wherein both the small area of an organic photovoltaic device formed by active area partitioning with insulating partitioning walls introduced into the device according to the method of the present invention and the large area organic photovoltaic device formed according to the prior art method are formed thereon. At this time, the organic photovoltaic device was prepared by spin coating a P3HT/PCBM blend, which is the representative organic blend useful for forming a bicontinuous interpenetrating network structure, on a transparent electrode, and depositing aluminum as an electrical charge extraction electrode thereon. When a single large area cell with no partitioning wall and a plurality of small area subcells including partitioning walls are formed in a single device like this, it is possible to reduce errors that can occur during the fabrication process. This allows the device characteristics to be accurately assessed and directly compares the organic photovoltaic device according to the present invention with that according to the prior art.

First, acrylic photocurable resin was employed as an insulating partitioning wall material. The insulating partitioning walls were formed by using the resin on an ITO glass (1×1 inch) according to a photolithographic process to thereby partition off the device into several smaller subcells. At this time, the partitioned subcells by the introduced insulating partitioning walls therein had a size of 300×300 μm, and an interval between the partitioned subcells was 200 μm. The ITO glass on which the insulating partitioning walls were formed was washed with chloroform and isopropylalcohol, and then treated with $O_2$ plasma for 15 minutes, thereby removing organic impurities.

A PEDOT:PSS (poly 3,4-ethylenedioxythiophene:polystyrenesulfonate) Baytron P solution (Bayer, Germany) having a conductivity of 1 S/cm was subjected to spin coating on the ITO glass at a speed of 2500 rpm. The ITO glass was then dried in a vacuum oven at 120☐ to thereby form an electron protection/charge extraction layer of 35 nm in thickness.

P3HT [poly(3-hexylthiophene)] and PCBM ([6,6]-phenyl $C_{61}$-butyric acid methyl ester) were mixed at a weight ratio of 1:0.6 and dissolved in monochlorobenzene to form a 2.4 wt% p-n type polymer blend. The p-n type polymer blend was subjected to spin coating on the ITO glass coated with PEDOT:PSS at a speed of 1000 rpm and pre-annealing at 150☐ for about 10 minutes, thereby forming a p-n type polymer nanocomposite structure of 220 nm in thickness as a photovoltaic active layer.

LiF was deposited under vacuum on the p-n type polymer nanocomposite structure to form an organic protection layer of 0.8 nm in thickness, followed by vacuum deposition of aluminum thereon, thereby forming a metal electrode of 150 nm in thickness. The ITO glass was then subjected to post-annealing at 150☐ for about 10 minutes in order to finally fabricate an organic photovoltaic device.

A prior art organic photoelectric conversion device was fabricated as a control according to the same method as described above except for the introduction of insulating partitioning walls.

Example 2

Characteristic Analysis of an Organic Photovoltaic Device

A current-voltage (I-V) characteristic of the organic photovoltaic device fabricated in Example 1 was measured by using a Keithley 2400 source-measure unit. The results are shown in FIGS. 3a and 3b. At this time, a Xe lamp (300 W) was used as a light source. Further, the strength of light was regulated by using an air mass filter (AM 1.5, Oriel) under the illumination condition of imitating an irradiation wavelength of sunlight, in combination with the use of a neutral density filter if necessary. The strength of light irradiation was measured by using a calibrated broadband optical power meter (Spectra Physics model 404).

As shown in FIG. 3a, the open circuit voltage of the organic photovoltaic device fabricated according to the prior art method was 0.56697 V, the short circuit current density thereof was 9.8639 mA/cm$^2$, the fill factor thereof was 0.36961, and the power conversion efficiency thereof was 2.067%. On the other hand, FIG. 3b showed that the organic photovoltaic device fabricated by active area partitioning with insulating partitioning walls according to the method of the present invention has 0.60901 V of the open circuit voltage, 15.579 mA/cm$^2$ of the short circuit current density, 0.4109 of the fill factor, and 3.8986% of the power conversion efficiency. These results confirmed that the organic photovoltaic device according to the method of the present invention exhibits about 2-fold higher power conversion efficiency compared to that according to the prior art method.

Example 3

Change in Power Conversion Efficiency Depending on Conductivity of an Electrode Protection Layer In order to examine the effect of a correlation between conductivity of an electrode protection layer and active area partitioning on power conversion efficiency in the organic photovoltaic device according to the present invention, the electrode protection layer was formed by using Baytron Al 4083 (Bayer) having a conductivity of $10^{-3}$ S/cm instead of using the Baytron P layer having a conductivity of 1 S/cm. Except for using Baytron Al 4083 as an electrode protection layer, the organic photovoltaic device through active area partitioning according to the method as described in Example 1 and the organic photovoltaic device according to the prior art method were also fabricated in a single cell device. Their current-voltage characteristics were analyzed according to the same method as described in Example 2.

As a result, as can be seen in FIG. 4a, the organic photovoltaic device fabricated according to the prior art method showed 0.64805 V of the open circuit voltage, 7.6775 mA/cm$^2$ of the short circuit current density, 0.4506 of the fill factor, and 2.2419% of the photoelectric conversion efficiency. On the other hand, as illustrated in FIG. 4b, the organic photovoltaic device fabricated by area partition according to the method of the present invention exhibited 0.64354 V of the open circuit voltage, 7.9238 mA/cm$^2$ of the short circuit current density, 0.42699 of the fill factor, and 2.1773% of the photoelectric conversion efficiency. The difference in power conversion efficiency between these two devices merely corresponds to the level of an experimental error.

From these results, it has been found that in case of using a low conductive material as an electrode protection layer, even if the device is fabricated in a small area type through active area partitioning by introducing insulating partitioning walls, the increase in power conversion efficiency is insignificant. This suggests that there is a correlation between the insulating partitioning walls and the conductivity of a charge extraction layer. This means that the active area partitioning by introducing insulating partitioning walls according to the present invention is a creative and superior method of improving the power conversion efficiency of a device due to the application of a charge extraction layer with high conductivity.

In order to systematize the results obtained from Examples 2 and 3, the series resistance was calculated from the current-voltage characteristic graph and is summarized below in Table 1. The series resistance was represented as a reciprocal number of a slope at higher voltage than open circuit voltage in the current-voltage characteristic graph of each device.

TABLE 1

| Fabrication method | High conductive electrode protection/charge extraction layer | | Low conductive electrode protection/charge extraction layer | |
|---|---|---|---|---|
| | Prior art | Active area partitioning | Prior art | Active area partitioning |
| Open circuit voltage (V) | 0.57 | 0.61 | 0.65 | 0.64 |
| Short circuit current density (mA/cm$^2$) | 9.86 | 15.6 | 7.68 | 7.92 |
| Power conversion efficiency (%) | 2.07 | 3.90 | 2.24 | 2.18 |
| Series resistance (Ω) | 6.66 | 3.64 | 5.40 | 5.0 |

As shown in Table 1, it has been confirmed that the device fabricated by using the electrode protection/charge extraction layer with low conductivity does not show any significant decrease in the total series resistance even though it is partitioned off. This suggests that when the series resistance of the charge extraction layer is high, that is, when the charge extraction layer exhibits low conductivity, there is no significant decrease in series resistance between the devices, even if the device is partitioned off by introducing insulating partitioning walls therein according to the present invention. That is, since the resistance value owing to the charge extraction layer is too large, such a device does not exert the effect of removing the interference phenomenon owing to the lateral contribution of series resistance derived from other neighboring devices.

However, in the case of the device using the charge extraction layer with high conductivity, when each small subcell is separated from the mutual effect by introducing the insulating partitioning walls according to the present invention, the interference phenomenon due to the lateral contribution of series resistance from the neighboring subcells is significantly reduced. Thus, the series resistance is remarkably decreased simultaneously with increasing the amount of current extracted from the device. This results in showing the improved power conversion efficiency.

As such, the method of the present invention exhibits the effect of improving power conversion efficiency by reducing series resistance through active area partitioning, which can be logically explained by measuring a total series resistance value. Thus, the active area partitioning method of the present invention can improve the power conversion efficiency of the prior art device by about 2-fold.

While the present invention has been described and illustrated with respect to a preferred embodiment of the invention, it will be apparent to those skilled in the art that variations and modifications are possible without deviating from the broad principles and teachings of the present invention, which should be limited solely by the scope of the claims appended hereto.

What is claimed is:

1. A method of fabricating an organic photovoltaic device with improved power conversion efficiency, wherein the device is partitioned into a plurality of subcells, the method comprising:
   1) forming a pattern of insulating partitioning walls on top of a transparent electrode which is formed on a transparent substrate;
   2) forming an electrode protection/charge extraction layer on the transparent electrode on which the insulating partitioning walls are formed;
   3) forming a p-n type polymer nanocomposite structure on the electrode protection/charge extraction layer; and
   4) depositing a metal electrode on the p-n type polymer nanocomposite structure.

2. The method according to claim 1, wherein the pattern of insulating partitioning walls is made from polymer-based insulating materials selected from the group consisting of acrylic polymers, polyimides and polysiloxanes.

3. The method according to claim 1, wherein the pattern of insulating partitioning walls is formed by using a technique selected from the group consisting of coating, printing, vacuum deposition, lithography, transcription and laser ablation, wherein the coating technique includes spin coating, dip coating, blade coating, bar coating, slot-die coating and spray coating, the printing technique includes inkjet printing, gravure printing, offset printing and screen printing, the vacuum deposition technique includes evaporation and sputtering, the lithography technique includes photolithography and imprint lithography, and the transcription technique includes laser/lamination heat transcription.

4. The method according to claim 1, wherein the transparent substrate is selected from the group consisting of glass, silica and transparent plastics, wherein the transparent plastics include PET (polyethylene terephthalate) and polyethersulfone.

5. The method according to claim 1, wherein the transparent electrode is selected from the group consisting of transparent conducting oxide (TCO), poly(3,4-ethylenedioxythiophene):poly(4-styrenesulphonate) (PEDOT:PSS), polyaniline and polypyrrole, wherein the transparent conducting oxide includes indium tin oxide (ITO), indium zinc oxide (IZO) and aluminum-doped zinc oxide.

6. The method according to claim 1, wherein the electrode protection/charge extraction layer is selected from the group consisting of poly(3,4-ethylenedioxythiophene):poly(4-styrenesulphonate) (PEDOT:PSS), polyaniline and polypyrrole.

7. The method according to claim 1, wherein the p type polymer is selected from the group consisting of polythiophene, poly(para-phenylene), polyfluorene, polyacetylene and derivatives thereof.

8. The method according to claim 1, wherein the n type polymer is selected from the group consisting of fullerene, high electron affinity organic materials and derivatives thereof, wherein the fullerene includes C60 fullerene and C70 fullerene, and the high electron affinity organic material includes perylenetetracarboxylic bisbenzimidazole (PTCBI).

9. The method according to claim 1, wherein the metal electron is selected from the group consisting of aluminum, magnesium, lithium, calcium, copper, silver, gold, platinum and alloy thereof.

* * * * *